United States Patent
Yang

(10) Patent No.: US 11,322,522 B2
(45) Date of Patent: May 3, 2022

(54) ARRAY SUBSTRATE

(71) Applicant: Wuhan China Star Optoelectronics Semiconductor Display Technology Co., Ltd., Hubei (CN)

(72) Inventor: Weiwei Yang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 278 days.

(21) Appl. No.: 16/624,792

(22) PCT Filed: Oct. 21, 2019

(86) PCT No.: PCT/CN2019/112089
§ 371 (c)(1),
(2) Date: Dec. 19, 2019

(87) PCT Pub. No.: WO2021/012429
PCT Pub. Date: Jan. 28, 2021

(65) Prior Publication Data
US 2021/0366934 A1 Nov. 25, 2021

(30) Foreign Application Priority Data
Jul. 22, 2019 (CN) .......................... 201910660434.7

(51) Int. Cl.
*H01L 27/12* (2006.01)
(52) U.S. Cl.
CPC ........ *H01L 27/124* (2013.01); *H01L 27/1255* (2013.01)

(58) Field of Classification Search
CPC .......................... H01L 27/1255; H01L 27/124
See application file for complete search history.

(56) References Cited

U.S. PATENT DOCUMENTS

| 2015/0090980 | A1* | 4/2015 | Lee | ..................... H01L 27/1259 257/40 |
| 2018/0097016 | A1 | 4/2018 | Yang et al. | |
| 2019/0013339 | A1 | 1/2019 | Li et al. | |
| 2019/0235672 | A1* | 8/2019 | Ichiki | ....................... G02B 1/14 |
| 2020/0035942 | A1 | 1/2020 | Xie et al. | |

FOREIGN PATENT DOCUMENTS

| CN | 107871757 A | 4/2018 |
| CN | 107887413 A | 4/2018 |
| CN | 109037465 A | 12/2018 |

* cited by examiner

*Primary Examiner* — Trang Q Tran
(74) *Attorney, Agent, or Firm* — Geoffrey Lottenberg; Berger Singerman, LLP

(57) ABSTRACT

An array substrate provided. Since arranging a second metal layer into a grid structure, the grid structure and a constant voltage signal trace disposed on a third metal layer are connected in parallel, and a storage capacitor is used as a connection point for the grid structure. The grid structure ensures a high pixel density and also reduces voltage drop, thereby improving brightness uniformity. Moreover, in the manufacturing process, the grid structure and the second metal layer can be formed simultaneously, thereby eliminating a need for additional processes and saving cost.

8 Claims, 4 Drawing Sheets

ARRAY SUBSTRATE

CROSS-REFERENCE TO RELATED APPLICATIONS

This application is the National phase under 35 U.S.C. § 371 of International Application No. PCT/CN2019/112089, filed Oct. 21, 2019, which claims the benefit of and priority to Chinese Patent Application No. 201910660434.7, filed Jul. 22, 2019. The entire contents of these patent applications are hereby incorporated by reference herein.

BACKGROUND OF INVENTION

Field of Invention

The present invention relates to the field of display technology, and more particularly, to an array substrate.

Description of Prior Art

Organic light-emitting diode (OLED) devices have advantages of light weight, self-illumination, wide viewing angles, low driving voltage, high luminous efficiency, low power consumption, and fast response, and thus have a wide range of applications. In particular, flexible display devices have the characteristics of being foldable and easy to carry, and have become a major area of research and development in the field of display technology.

Currently, high-end mobile phones have higher requirements for brightness uniformity. How to improve brightness uniformity of screens is a key direction for development of major manufacturers. In the prior art, APPLE mobile phones add a metal layer above source and drain electrodes, and VDD traces (mainly power supply, powerline) are formed a grid structure, thereby reducing voltage drop, thereby improving brightness uniformity. However, such design increases steps in manufacturing process, which significantly increase manufacturing cost.

Therefore, it is necessary to provide a new array substrate to solve the problem of voltage drop in prior art and the problem of manufacturing cost, thereby reducing voltage drop while reducing manufacturing cost.

SUMMARY OF INVENTION

An array substrate is provided. Since arranging the second metal layer into a grid structure, the grid structure is connected to a constant voltage signal trace in parallel for transmitting a voltage signal. The grid structure ensures a high pixel density and also reduces voltage drop, thereby improving brightness uniformity.

An array substrate includes a substrate, an active layer disposed on the substrate, a first insulating layer disposed on the active layer and the substrate, a first metal layer disposed on a side of the first insulating layer away from the active layer, a second insulating layer disposed on the first metal layer and the first insulating layer, a second metal layer disposed on a side of the second insulating layer away from the first metal layer, a third insulating layer disposed on the second metal layer and the second insulating layer, and a third metal layer. The third metal layer includes a constant voltage signal trace and is disposed on a side of the third insulating layer away from the second metal layer. The second metal layer includes a first metal trace disposed along a first direction and a second metal trace disposed along a second direction, the first metal trace and the second metal trace are interlaced to form a grid structure, and the grid structure is connected to the constant voltage signal trace.

In one embodiment, the first metal trace is connected to the constant voltage signal trace; and/or the second metal trace is connected to the constant voltage signal trace.

In one embodiment, a material of the second metal layer and the third metal layer includes a low resistance material of an aluminum alloy.

In one embodiment, the second insulating layer includes a first through hole, the first through hole penetrates through the second insulating layer and a portion of the first insulating layer to the active layer, and the grid structure is connected to the active layer through the first through hole.

In one embodiment, the third insulating layer includes a second through hole, and the second through hole penetrates through a portion of the third insulating layer to the grid structure, and the constant voltage signal trace is connected to the grid structure through the second through hole.

In one embodiment, the first through hole is disposed opposite to the second through hole.

In one embodiment, the array substrate further includes a thin film transistor disposed on the substrate, and the thin film transistor includes a semiconductor, a storage capacitor, a first gate line, a second gate line, a source trace, and a drain trace. The semiconductor is disposed in the active layer, the first gate line is disposed in the first metal layer, the second gate line is disposed in the second metal layer, and the source trace and the drain trace are disposed in the third metal layer.

In one embodiment, the third insulating layer includes a third through hole, the third through hole penetrates a portion of the third insulating layer, the second insulating layer, and a portion of the first insulating layer to a surface of the active layer, and the source trace and the drain trace are connected to the active layer through the third through hole. The constant voltage signal trace is connected to the active layer through the third through hole.

In one embodiment, the storage capacitor is disposed at an intersection of the grid structure.

In one embodiment, the array substrate further includes a planarization layer, a first electrode, and a pixel defining layer, and the first electrode and the pixel defining layer are sequentially disposed on the planarization layer, and the planarization layer is disposed on the third metal layer and the third insulating layer.

An array substrate is provided. Through arranging the second metal layer into a grid structure, the grid structure and the constant voltage signal trace disposed on the third metal layer are connected in parallel for transmitting a voltage signal. The grid structure ensures a high pixel density and also reduces voltage drop, thereby improving brightness uniformity. Moreover, in the manufacturing process, the grid structure and the second metal layer can be formed simultaneously, thereby eliminating a need for additional processes and saving cost.

BRIEF DESCRIPTION OF DRAWINGS

In order to more clearly illustrate the technical solutions in the embodiments of the present invention, the drawings used in the description of the embodiments will be briefly described below. It is obvious that the drawings in the following description are only some embodiments of the present invention. Other drawings can also be obtained from skilled persons in the art based on these drawings without making any creative effort.

Figure 1:
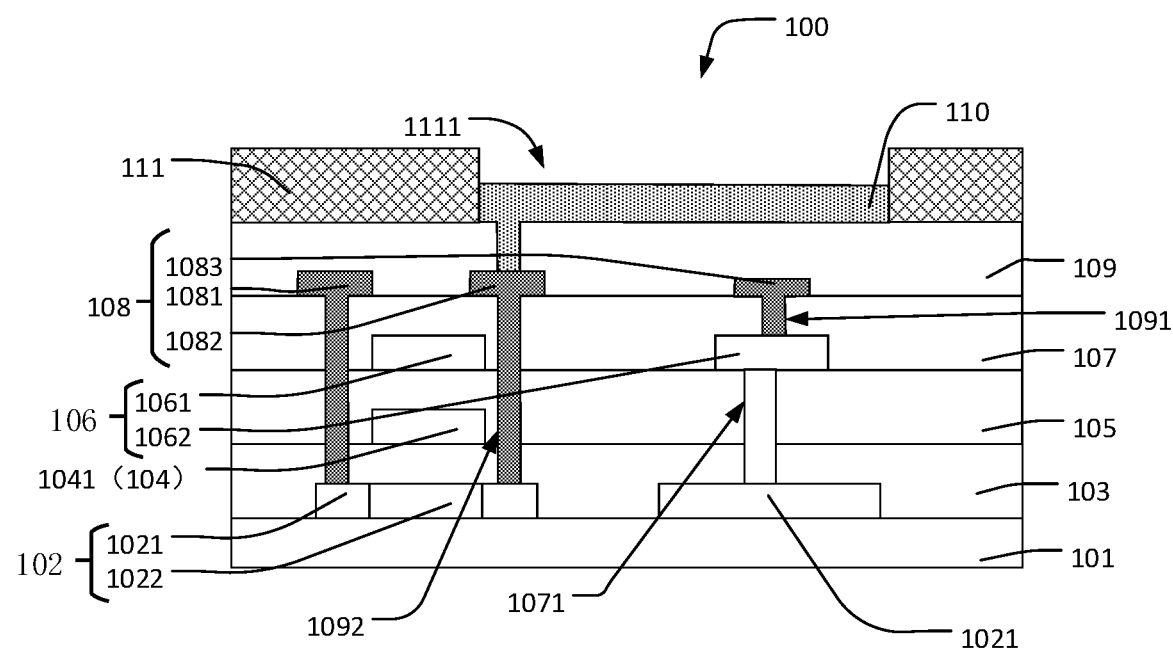
FIG. 1 is a schematic view of an array substrate according to one embodiment of the present invention.

ELEMENT REFERENCE array substrate 101; active layer 102; first insulating layer 103; first metal layer 104; second insulating layer 105; second metal layer 106; third insulating layer 107; third metal layer 108; planarization layer 109; a first electrode 110; pixel defining layer 111; functional region 1022; connection region 1021; first direction 210; first metal trace 1062a; second direction 220; second metal trace 1062b; grid structure 1062; power supply trace 1083; voltage signal trace 1083a; variable voltage signal trace 1083b; first through hole 1071; second through hole 1091; third through hole 1092; first gate line 1041; second gate line 1061; source trace 1081; drain trace 1082; lower plate capacitor 1042; upper plate capacitor 1063; slot 1111; anode trace 1101; and reset trace 1102

DETAILED DESCRIPTION OF PREFERRED EMBODIMENTS

The following description of the various embodiments is intended to be illustrative of the specific embodiments. The directional terms mentioned in the present invention, such as upper, lower, front, back, left, right, inside, outside, side, etc., are merely directions of the drawings. The names of the elements mentioned in the present invention, such as the first, second, etc., are only distinguishing between different components and can be better expressed. In the drawings, structurally similar elements are denoted by the same reference numerals.

Embodiments of the present invention are described in detail herein with reference to the drawings. The present invention may be embodied in many different forms and the present invention is not to be construed as being limited to the specific embodiments set forth herein. The embodiments of the present invention are provided to explain the practical application, so that skilled persons in the art can understand various embodiments of the present invention and various modifications suitable for the particular intended application.

Referring to FIG. 1, an array substrate 100 includes a substrate 101, an active layer 102, a first insulating layer 103, a first metal layer 104, a second insulating layer 105, a second metal layer 106, a third insulating layer 107, a third metal layer 108, a planarization layer 109, a first electrode 110, and a pixel defining layer 111.

The substrate 101 is a flexible substrate, and material of the substrate 101 is polyimide film. A barrier layer and a buffer layer are sequentially disposed on the substrate 101 to protect the substrate 101.

Figure 2:
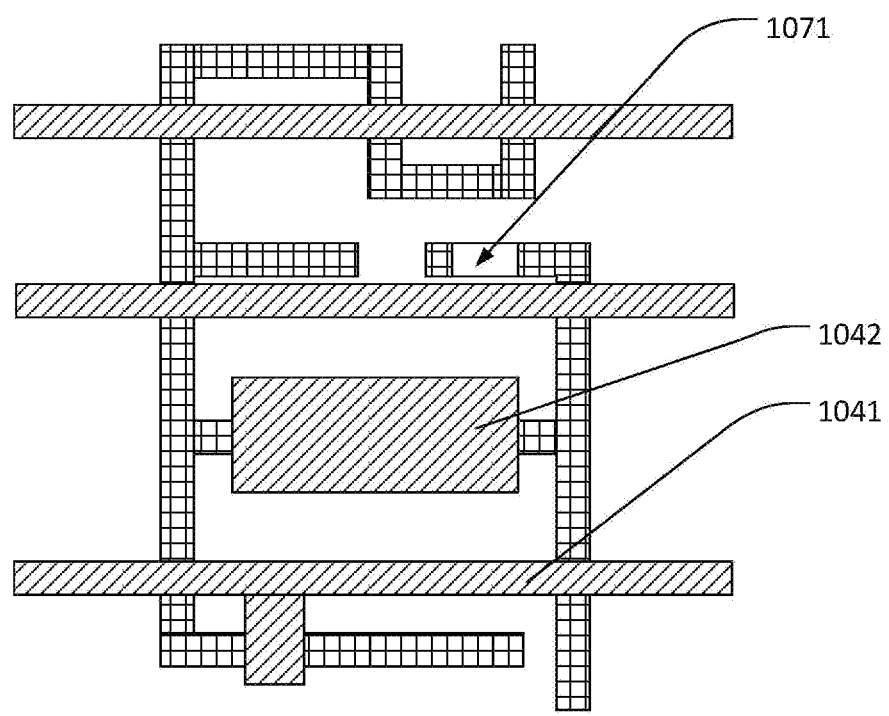
FIG. 2 is a schematic view of a stack of an active layer and a first metal layer stack according to one embodiment of the present invention.

Referring to FIG. 2 and FIG. 1, the active layer 102 is disposed on the substrate 101, and material of the active layer 102 is polysilicon. The active layer 102 includes a functional region 1022 and a connection region 1021.

The active layer 102 includes traces arranged horizontally and vertically, and adjacent vertical traces are connected to each other by horizontal traces.

The first insulating layer 103 is disposed on the active layer 102 and the substrate 101, and the first metal layer 104 is disposed on a side of the first insulating layer 103 away from the active layer 102.

The first metal layer 104 includes a lower plate capacitor 1042 and a first gate line 1041. The first gate line 1041 is connected to a scan line. The lower plate capacitor 1042 is disposed between the adjacent vertical traces.

The second insulating layer 105 is disposed on the first metal layer 104 and the first insulating layer 103. The second insulating layer 105 includes a first through hole 1071, and the first through hole 1071 penetrates through the second insulating layer 105 and a portion of the first insulating layer 103 to the active layer 102.

The second metal layer 106 is disposed on a side of the second insulating layer 105 away from the first metal layer 104. The second metal layer 106 and the third metal layer 108 are made of the same low resistance material.

Figure 3:
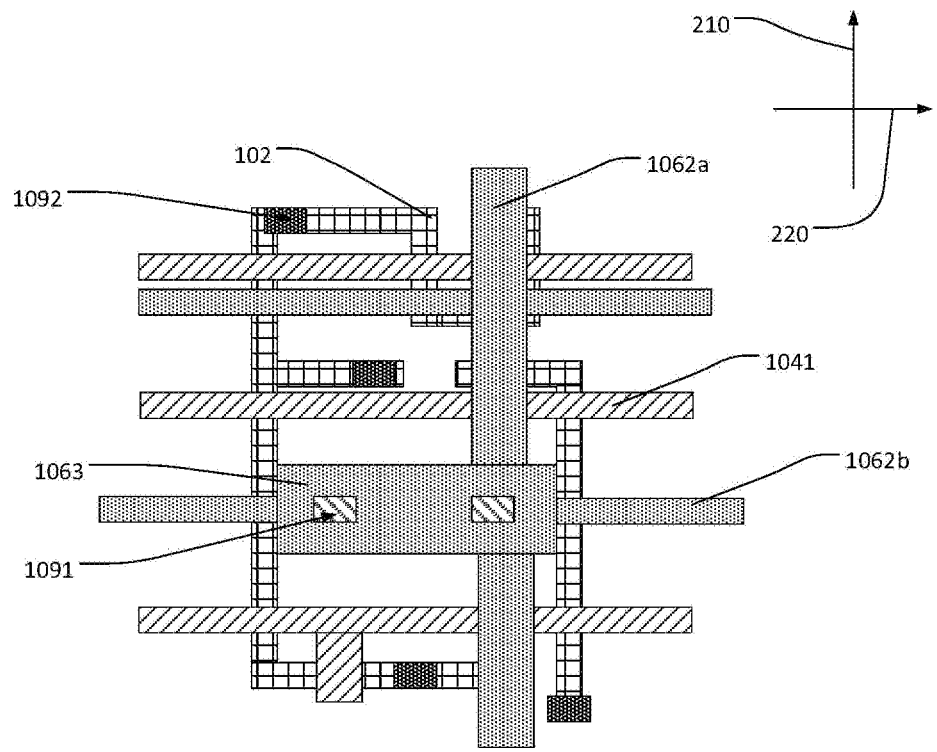
FIG. 3 is a schematic view of a stack of an active layer, a first metal layer, and a second metal layer according to one embodiment of the present invention.

Referring to FIG. 3, the second metal layer 106 includes a first metal trace 1062a disposed along a first direction 210 and a second metal trace 1062b disposed along a second direction 220. The first metal trace 1062a and the second metal trace 1062b are interlaced to form a grid structure 1062, and the grid structure 1062 is connected to a constant voltage signal trace 1083a and the active layer 102. Specifically, the grid structure 1062 is connected to the connection region 1021 of the active layer 102.

An upper plate capacitor 1063 is formed at an intersection of the grid structure 1062. The upper plate capacitor 1063 and the lower plate capacitor 1042 form a storage capacitor. The upper plate capacitor 1063 corresponds to the lower plate capacitor 1042.

The grid structure 1062 ensures high pixel density and also reduces voltage drop, thereby improving brightness uniformity. The grid structure 1062 is connected to the active layer 102 through the first through hole 1071. The grid structure 1062 is configured to transmit a received power signal to the active layer 102.

The third insulating layer 107 is disposed on the second metal layer 106 and the second insulating layer 105. The third insulating layer 107 includes a second through hole 1091, and the second through hole 1091 penetrates a portion of the third insulating layer 107 to a surface of the grid structure 1062.

Therefore, the voltage signal trace 1083a of a power supply trace 1083 can mutually transmit voltage signals with the active layer 102 through the first through hole 1071, the grid structure 1062, and the second through hole 1091.

The first through hole 1071 is disposed opposite to the second through hole 1091. The first through hole 1071 and the second through hole 1091 are formed an aperture structure, and the power supply trace 1083 is connected to the active layer 102 through the aperture structure, and the power supply trace 1083 may pass through the grid structure 1062, thereby reducing the voltage drop.

Figure 4:
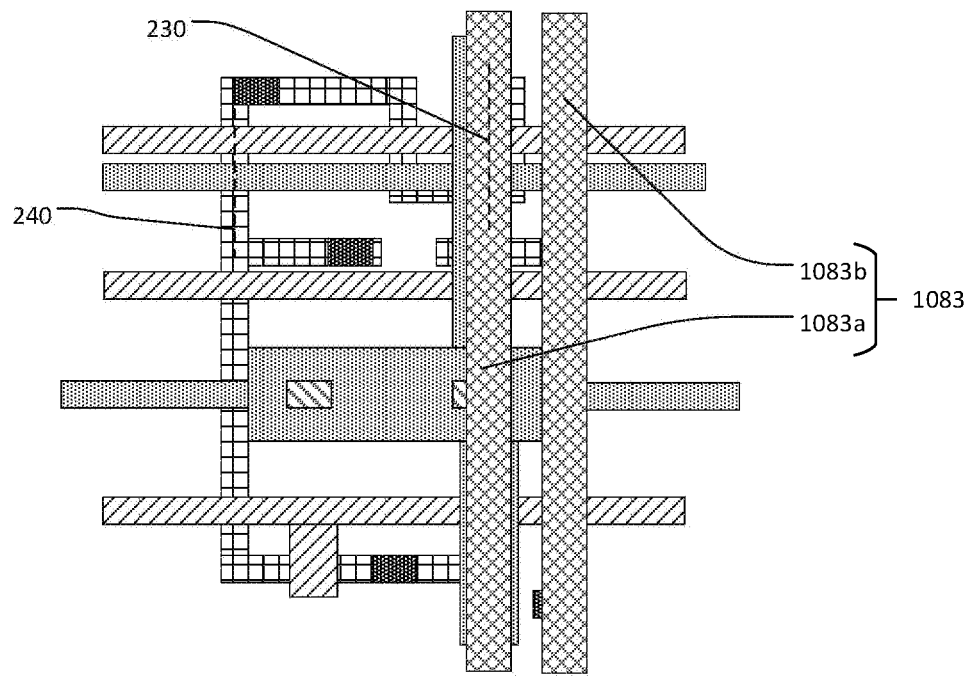
FIG. 4 is a schematic view of a stack of an active layer, a first metal layer, a second metal layer, and a third metal layer according to one embodiment of the present invention.

Referring to FIG. 4 and FIG. 1, the third metal layer 108 is disposed on a side of the third insulating layer 107 away from the second metal layer 106. The power supply trace 1083 is disposed in the third metal layer 108. The power supply trace 1083 is connected to the grid structure 1062 through the second through hole 1091.

The power supply trace 1083 includes the constant voltage signal trace 1083a and a variable voltage signal trace 1083b. The first metal trace 1062a or the second metal trace 1062b can be connected to the constant voltage signal trace 1083a.

The array substrate 100 further includes a thin film transistor disposed on the substrate 101. The thin film transistor includes a semiconductor, the storage capacitor, the first gate line 1041, a second gate line 1061, a source trace 1081, and a drain trace 1082.

The semiconductor is disposed in the active layer 102. The first gate line 1041 is disposed in the first metal layer 104. The first gate line 1041 is connected to a scan line. The second gate line 1061 is disposed in the second metal layer 106. The source trace 1081 and the drain trace 1082 are disposed in the third metal layer 108.

The third insulating layer 107 further includes a third through hole 1092, and the third through hole 1092 penetrates through a portion of the third insulating layer 107, the second insulating layer 105, and a portion of the first insulating layer 103 to a surface of the active layer 102.

The source trace 1081 and the drain trace 1082 are connected to the active layer 102 through the third through hole 1092. Specifically, the active layer 102 includes the functional region 1022 and the connection region 1021, and the source trace 1081 and the drain trace 1082 are connected to the connection region 1021. The storage capacitor is disposed at intersections of the grid structure 1062.

The variable voltage signal trace 1083b is connected to the active layer 102 through the third through hole 1092 for transmitting a data voltage signal.

The constant voltage signal trace 1083a may also be directly connected to the active layer 102 through the third through hole 1092, and the constant voltage signal trace 1083a, the source trace 1081, and the drain trace 1082 are not interconnected.

The planarization layer 109 is disposed on the third metal layer 108 and the third insulating layer 107.

Figure 5:
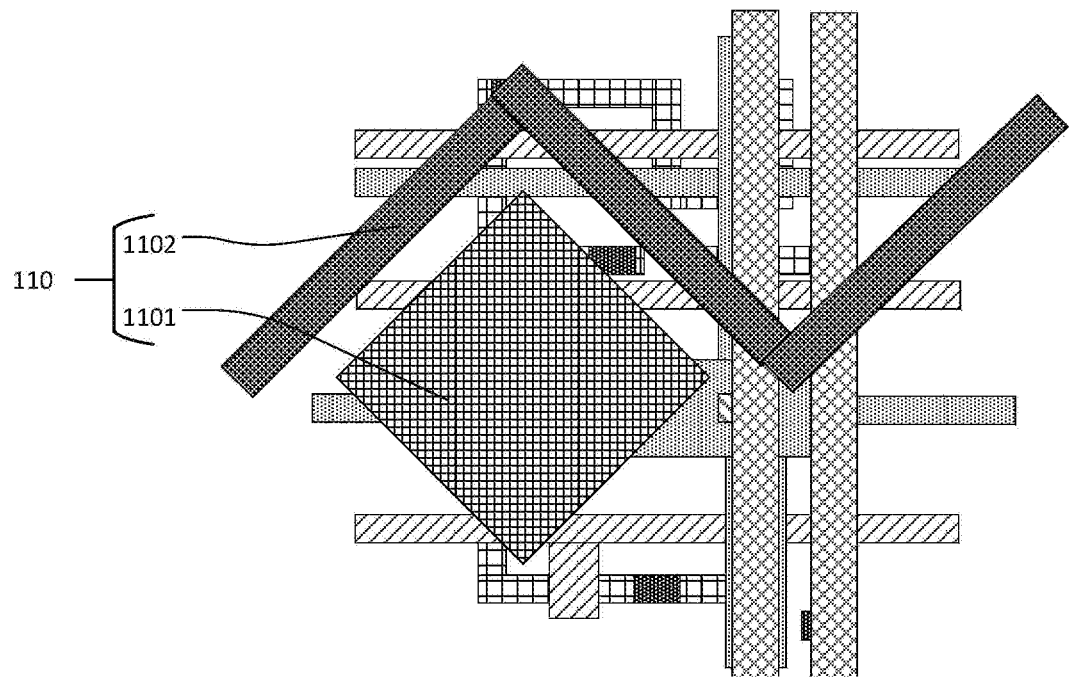
FIG. 5 is a schematic structural view of a stack of an active layer, a first metal layer, a second metal layer, a third metal layer, and a first electrode according to one embodiment of the present invention.

Referring to FIG. 5 and FIG. 1, the first electrode 110 is disposed on the planarization layer 109, and the first electrode 110 is connected to the source trace 1081 or the drain trace 1082 of the third metal layer 108. The first electrode 110 includes an anode trace 1101 and a reset trace 1102.

The pixel defining layer 111 is disposed on the first electrode 110 and the planarization layer 109. The pixel defining layer 111 includes a slot 1111. A surface of the first electrode 110 is exposed to the slot 1111.

Figure 6:
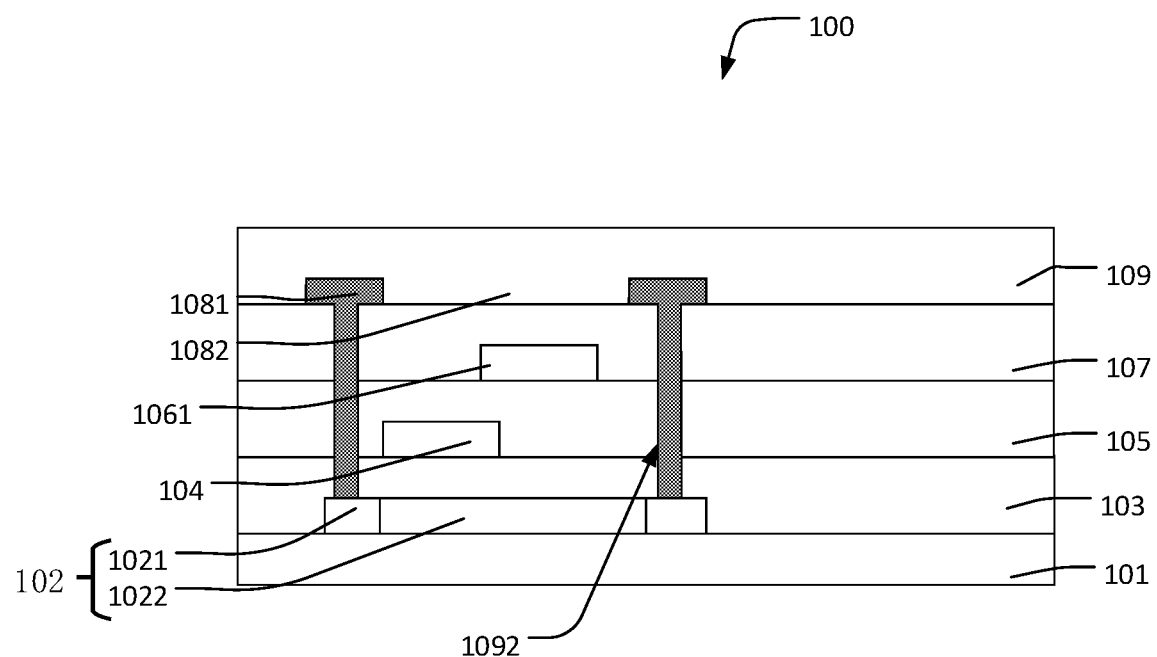
FIG. 6 is a cross-sectional view of FIG. 4 in a direction 240.

Referring to FIG. 6, it shows the thin film transistor structure according to one embodiment of the present invention, and it is obtained by cutting in a direction 240 according to FIG. 4. The thin film transistor includes a double gate structure for functioning as a switch.

Figure 7:
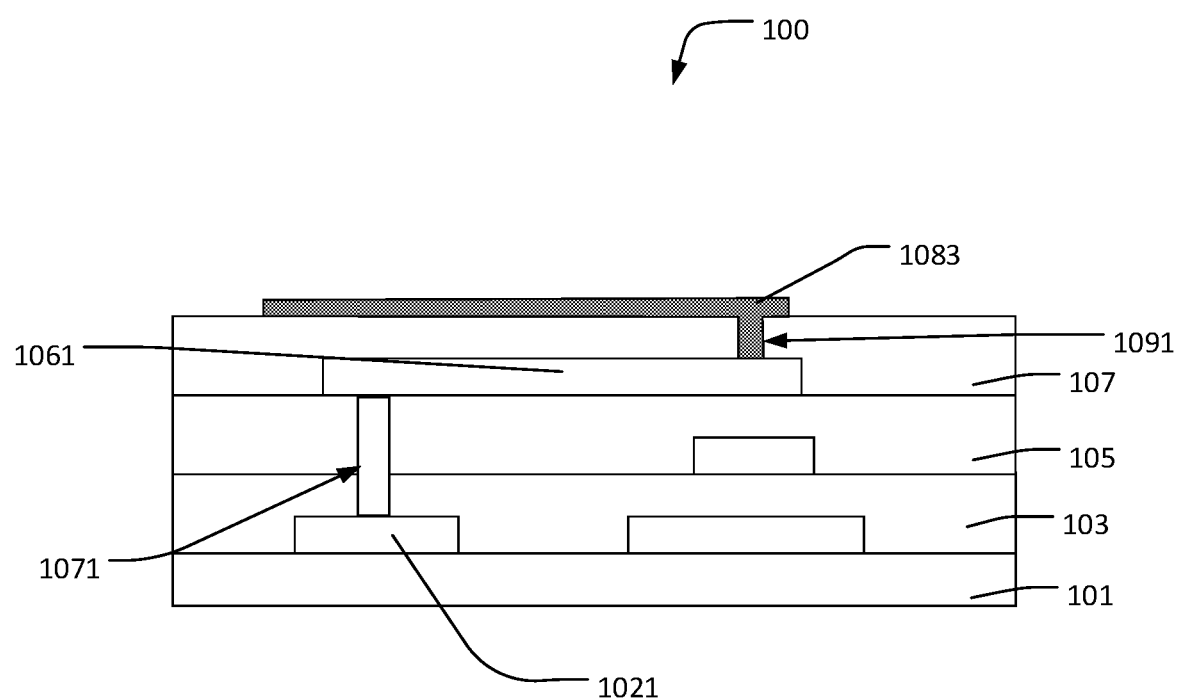
FIG. 7 is a cross-sectional view of FIG. 4 in a direction 230.

Referring to FIG. 7, it represents an innovation according to one embodiment of the present invention. A section is made along a direction 230 according to FIG. 4, that is, the second metal layer 106 is configured to form the grid structure 1062, and the grid structure 1062 and the constant voltage signal trace 1083a are connected in parallel, and the storage capacitor is used as a connection point for the grid structure 1062. The grid structure 1062 ensures a high pixel density and also reduces voltage drop, thereby improving brightness uniformity. Moreover, in the manufacturing process, the grid structure 1062 and the second metal layer 106 can be formed simultaneously, thereby eliminating a need for additional processes and saving cost.

The first through hole 1071 and the second through hole 1091 are not correspondingly disposed in the direction 230, and positions of the first through hole 1071 and the second through hole 1091 are not particularly limited.

The present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. An array substrate, comprising:
    a substrate;
    an active layer disposed on the substrate;
    a first insulating layer disposed on the active layer and the substrate;
    a first metal layer disposed on a side of the first insulating layer away from the active layer;
    a second insulating layer disposed on the first metal layer and the first insulating layer;
    a second metal layer disposed on a side of the second insulating layer away from the first metal layer;
    a third insulating layer disposed on the second metal layer and the second insulating layer; and
    a third metal layer, wherein the third metal layer comprises a constant voltage signal trace and is disposed on a side of the third insulating layer away from the second metal layer;
    wherein the second metal layer comprises a first metal trace disposed along a first direction and a second metal trace disposed along a second direction, the first metal trace and the second metal trace are interlaced to form a grid structure, and the grid structure is connected to the constant voltage signal trace;
    wherein the second insulating layer comprises a first through hole, the first through hole penetrates through the second insulating layer and a portion of the first insulating layer to the active layer, and the grid structure is connected to the active layer through the first through hole; and
    wherein the third insulating layer comprises a second through hole, and the second through hole penetrates through a portion of the third insulating layer to the grid structure, and the constant voltage signal trace is connected to the grid structure through the second through hole.

2. The array substrate according to claim 1, wherein the first metal trace is connected to the constant voltage signal trace; and/or the second metal trace is connected to the constant voltage signal trace.

3. The array substrate according to claim 1, wherein a material of the second metal layer and the third metal layer comprises a low resistance material of an aluminum alloy.

4. The array substrate according to claim 1, wherein the first through hole is disposed opposite to the second through hole.

5. The array substrate according to claim 1, further comprising a thin film transistor disposed on the substrate, and the thin film transistor comprises a semiconductor, a storage capacitor, a first gate line, a second gate line, a source trace, and a drain trace;
    wherein the semiconductor is disposed in the active layer, the first gate line is disposed in the first metal layer, the second gate line is disposed in the second metal layer, and the source trace and the drain trace are disposed in the third metal layer.

6. The array substrate according to claim 5, wherein the third insulating layer comprises a third through hole, the third through hole penetrates a portion of the third insulating layer, the second insulating layer, and a portion of the first insulating layer to a surface of the active layer, and the source trace and the drain trace are connected to the active layer through the third through hole; and wherein the constant voltage signal trace is connected to the active layer through the third through hole.

7. The array substrate according to claim 5, wherein the storage capacitor is disposed at an intersection of the grid structure.

8. The array substrate according to claim 1, further comprising a planarization layer, a first electrode, and a pixel defining layer, wherein the first electrode and the pixel defining layer are sequentially disposed on the planarization layer;

wherein the planarization layer is disposed on the third metal layer and the third insulating layer.

* * * * *